United States Patent [19]

Hastings et al.

[11] Patent Number: 4,689,559

[45] Date of Patent: Aug. 25, 1987

[54] APPARATUS AND METHOD TO REDUCE THE THERMAL RESPONSE OF SQUID SENSORS

[75] Inventors: Roger N. Hastings, Burnsville; Gerald F. Sauter, Eagan; George F. Nelson, Coon Rapids, all of Minn.

[73] Assignee: Sperry Corporation, Blue Bell, Pa.

[21] Appl. No.: 670,413

[22] Filed: Nov. 13, 1984

[51] Int. Cl.[4] .................... G01R 33/02; H03K 3/38
[52] U.S. Cl. .................................. 324/248; 307/306
[58] Field of Search .................. 324/248; 307/306; 361/149

[56] References Cited

U.S. PATENT DOCUMENTS 4,585,999  4/1986  Hilbert et al. .................. 324/248

FOREIGN PATENT DOCUMENTS 601845  5/1978  U.S.S.R. ............................ 361/149

OTHER PUBLICATIONS

Ketchen et al., "Thin-Film DC SQUID Gradiometer", IEEE Trans. on Magnetics, vol. Mag 13, No. 1, Jan./1977, pp. 372-374.

Primary Examiner—Reinhard J. Eisenzopf
Assistant Examiner—Walter E. Snow
Attorney, Agent, or Firm—Glenn W. Bowen; Laurence J. Marhoefer

[57] ABSTRACT

A SQUID, nominally of the "hybrid" type, wherein the normally superconducting modulation coil is modified to instead be a non-superconducting material, nominally manginin, exhibits reduced long-term, or d.c., thermal response. When an alternating current waveform—rising to a nominal 130 ma. r.m.s. amplitude within a nominal 0.5 seconds and, after a nominal 100 msec. to 20 sec. duration, returning to 0 within a nominal 0.1 sec—is applied to the non-superconducting modulation coil of such a SQUID at superconducting temperature then the entire SQUID thermal response, particularly including the short-term, or a.c., SQUID thermal response, is thereafter reducible to essentially 0. The process is hypothesized to "deflux" the SQUIDs of fluxons trapped during the cool-down of superconductor within the SQUID and associated circuitry. The optimal "de-fluxing" alternating current waveform for any individual SQUID is empirically derivable. Once "de-fluxed" a SQUID maintains a uniformly reduced thermal response for so long as it remains superconducting. SQUIDs may be repetitively initialized/reinitialized by "defluxing" without damage to the SQUID or diminishment of the effective reduction/elimination of thermal response.

10 Claims, 30 Drawing Figures

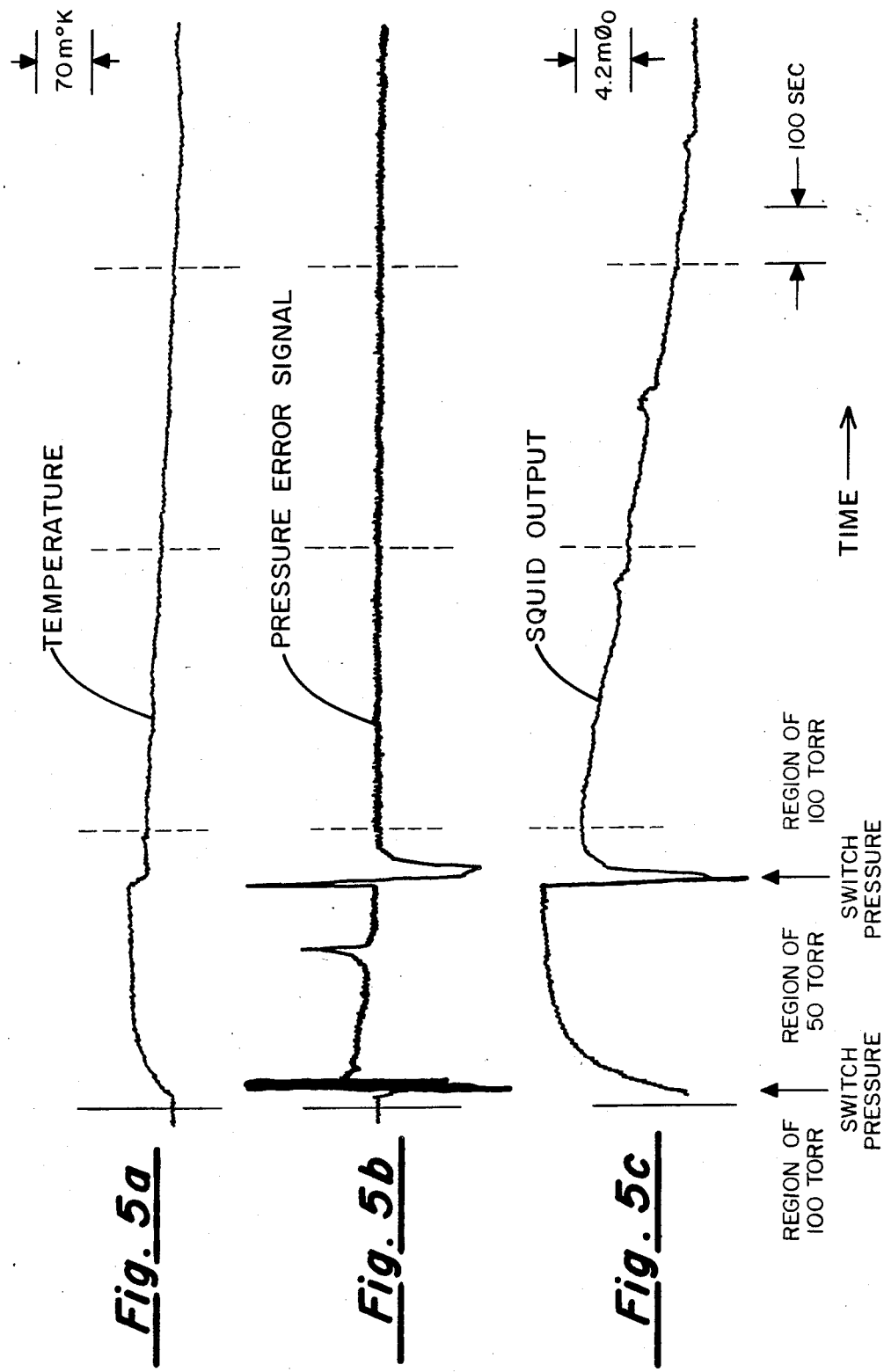

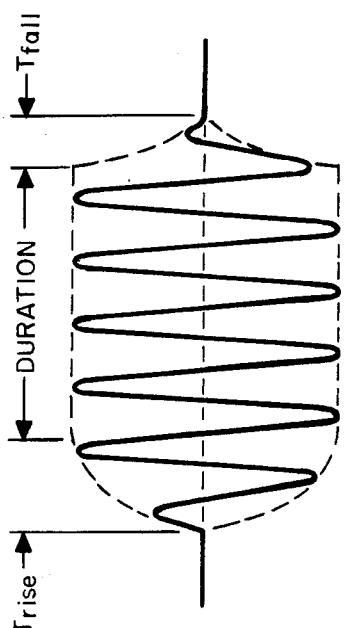
Fig. 9a
Fig. 9b
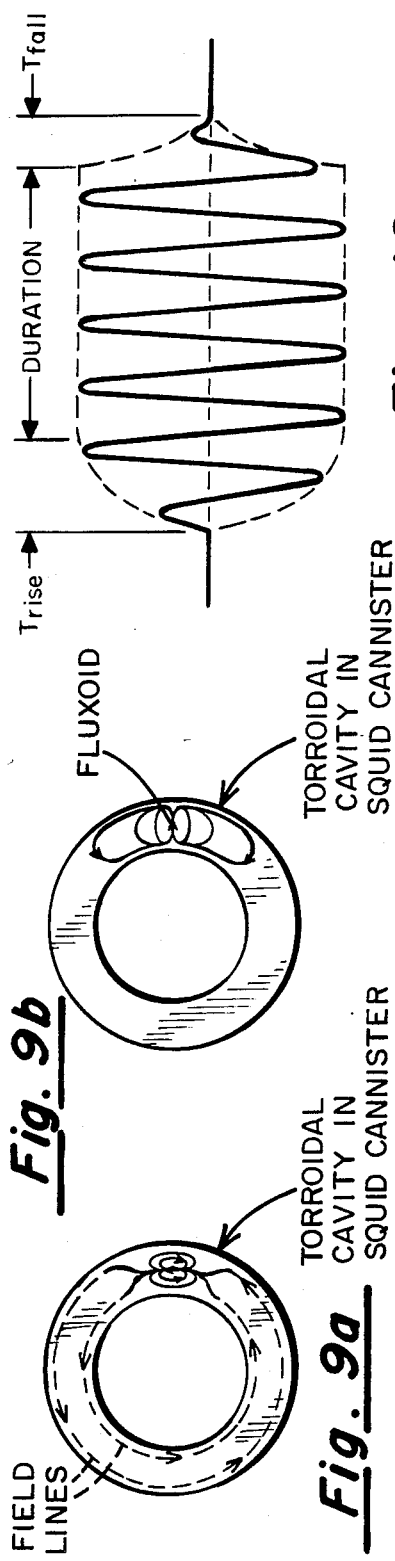
Fig. 12
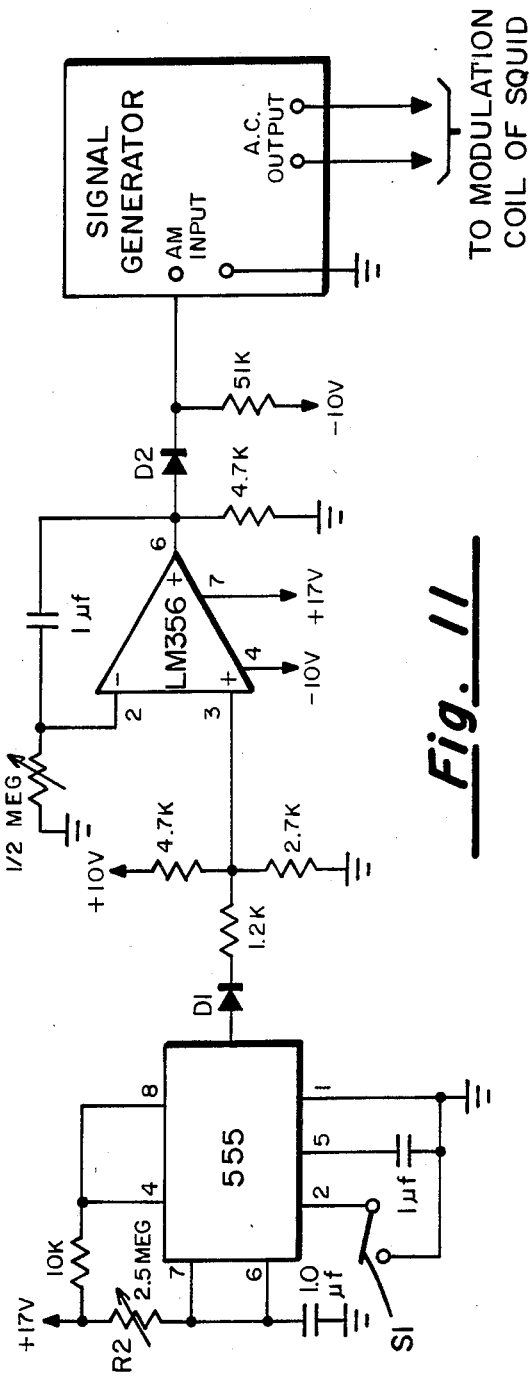
Fig. 11

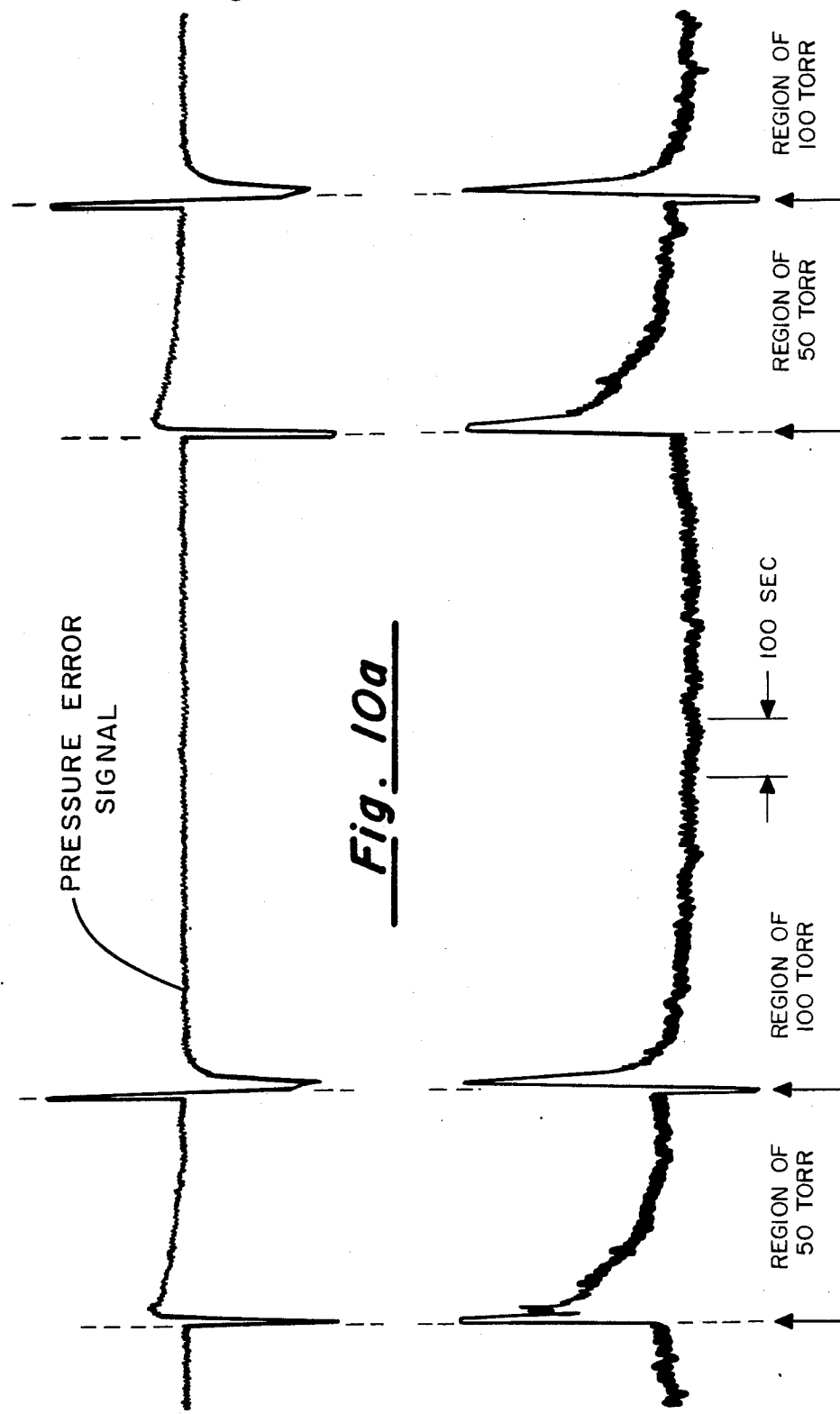

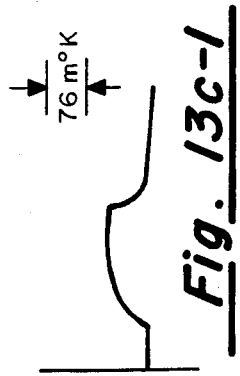
Fig. 13c-1
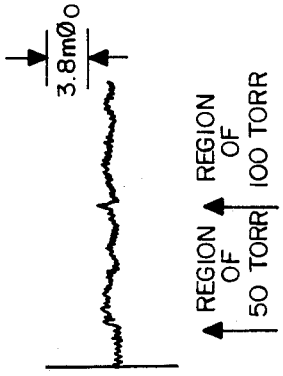
Fig. 13c-2
Fig. 13c-3
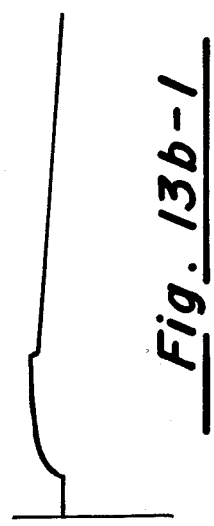
Fig. 13b-1
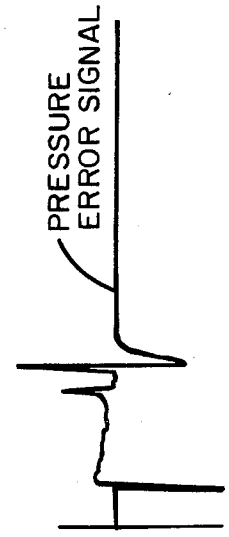
Fig. 13b-2
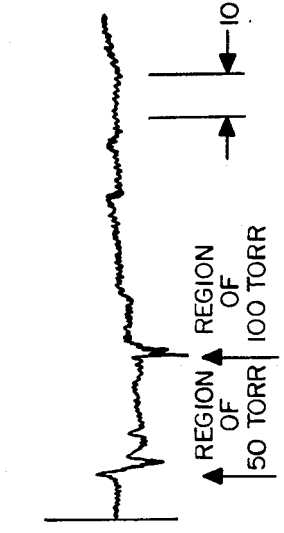
Fig. 13b-3
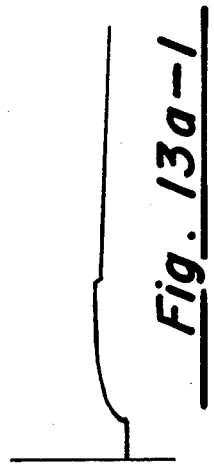
Fig. 13a-1
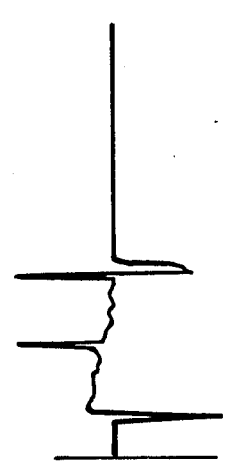
Fig. 13a-2
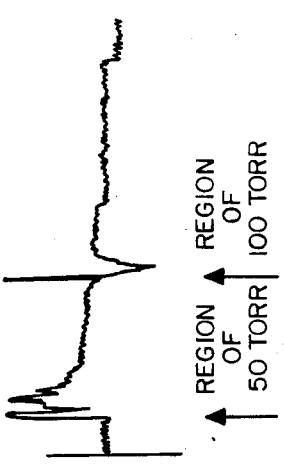
Fig. 13a-3

APPARATUS AND METHOD TO REDUCE THE THERMAL RESPONSE OF SQUID SENSORS

TABLE OF CONTENTS

BACKGROUND OF THE INVENTION
1. Field of Use
2. Background of the Prior Art

SUMMARY OF THE INVENTION
BRIEF DESCRIPTION OF THE DRAWINGS
DESCRIPTION OF THE PREFERRED EMBODIMENT
1. Introduction to the Thermal Response Problem in SQUIDs Dealt with by the Present Invention
2. Experimental Investigation of the Thermal Response Problems in SQUIDs Dealt with by the Present Invention
3. Theory and Analysis of the Thermal Response in SQUIDs
   3.1. Construction and Schematic Model of the DC SQUID
   3.2. Thermal Expansion
   3.3. Thermoelectric Effects
   3.4. Magnetic Impurities
   3.5. Temperature Dependence of Critical Junction Current
   3.6. RF Pick-Up
   3.7. Materials with Transitions Near 4.2 K.
   3.8. Penetration Depth Temperature Dependence
   3.9. Coherence Length Temperature Dependence
4. An improved SQUID Apparatus Using a Non-Superconducting Modulation Coil to Reduce the DC Component of Thermal Response in SQUIDs, Being a First Aspect of the Present Invention
5. Method of Heating/Defluxing the Improved SQUID Apparatus to Reduce the AC Component of Thermal Response In SQUIDs, Being a Second Aspect of the Present Invention
6. Theory of the Defluxing Method of the Present Invention

CLAIMS

BACKGROUND OF THE INVENTION

1. Field of Use

The present invention generally concerns the reduction of thermal response in superconducting quantum interference device (SQUID) sensors. The present invention particularly concerns the substitution of a non-superconducting modulation coil for a superconducting modulation coil in SQUIDs (nominally of the "hybrid" type) for the purposes of reducing the long-term, or d.c., component of thermal response; and the further method of temporarily emplacing an alternating current waveform upon such modulation coil for the purpose of initializing the SQUID to thereafter exhibit a lower total thermal response in both d.c. and short-term, or a.c., components.

2. Background of the Prior Art

It has long been known that the output of SQUID sensors of diverse types of construction, and both radio frequency (r.f.) and direct current (d.c.) in operation, do suffer changes, or drifts, with changes in the temperature of the cryogenic media (normally liquid helium) within which such SQUID sensors are immersed. Changes in the pressure within the dewar containing the cryogen within which the SQUID is immersed may also result in changes in the output of the SQUID sensor. These changes in SQUID output caused by temperature changes, or by pressure changes, or by temperature and by pressure changes are not desirable. In the use of SQUIDs for mobile sensor systems, such as in airborne superconducting gradiometer magnetometer sensor systems, those variations in SQUID sensor output associated with motion and with irreducible motion induced temperature flucuations have been the predominant source of sensor system noise, such noise as has typically been in excess of the desired sensitivity of the sensor system for certain practical uses, such as the detection of large ferromagnetic masses.

A large variety of mechanisms has been proposed to explain the significant thermal sensitivity problem in superconducting SQUID-based sensor systems. The mechanisms include thermal expansion, thermal electric effects, thermal dependence of the susceptibility of magnetic impurities, temperature dependence of junction critical currents, thermally induced changes in the r.f. pick-up coil, the presence of materials with superconducting transitions near the operating temperature, the temperature dependence of the penetration depth of superconducting materials, and the temperature dependence of the superconducting coherence length. A coherent, comprehensive, comparative assessment of these hypothetical contributions to the thermal response of SQUID sensors has not been undertaken, but many disparate observations and theories abound. By action of theoretical analysis undertaken in conjunct with the present invention, and by empirical observation of the results of the apparatus and method of the present invention in reducing the thermal response of SQUID sensors, it is hypothesized that the temperature dependence of superconducting coherence length is the most significant mechanism contributing to the thermal response of SQUID sensors, as well as being that mechanism which is most effectively dealt with in its respective long-term and short-term components by the respective apparatus and method of the present invention. Therefore the prior art dealing with the temperature dependence of the superconducting coherence length is most pertinent to the theory of the present invention as such invention is currently theoretically perceived to work.

The temperature dependence of the superconducting coherence length in SQUIDs produces a temperature dependence of the magnetic field distribution caused by a phenomena known as trapped flux, or fluxoids. A fluxoid is a discontinuity, or wormhole, in the magnetic field within a superconducting solid. A fluxoid represents a small region, of radius equal to the superconducting coherence length, of superconductor which remains non-superconducting because the magnetic field contained therein such small region is greater than the superconducting critical magnetic field. It is well known in the prior art that a superconductor cannot remain superconducting in the presence of a magnetic field strength greater than the superconducting critical magnetic field strength. The origin of this high field strength in the small region of the fluxoid is hypothesized to occur from the existence of a pinning site, being a stressed area of lower critical temperature $T_C$ than the surrounding portions of superconducting material which have already turned superconducting, existing within a superconducting solid during the cool-down of such superconducting solid. The region containing magnetic flux, completely encapsulated and surrounded by already superconducting material, continues to shrink in size as the temperature is reduced, the total flux within this region remaining, however, constant. Finally, at the lowest temperatures the size of the non-superconducting region, remaining non-superconducting because of the magnetic field strength contained therein, does equal a domain of radius equal to the coherence length: a trapped fluxoid. A prior art references dealing with trapped flux is the book by R. P. Heubeuer, *Magnetic Flux Structures in Superconductors*, (Springer-Verlag, Berlin 1979).

SUMMARY OF THE INVENTION

The present invention involves both, as a first aspect, a modification improvement to the apparatus of the prior art SQUID, and additionally, as a second aspect, a method of using the SQUID apparatus so modified.

In that first aspect of the present invention which is an improvement modification to the SQUID apparatus, the SQUID is modified by replacing the prior art superconducting modulation coil with a modulation coil of normal, non-superconducting, material. Diverse normal, non-superconducting, metals will suffice for this modification but the preferred embodiment coil is non-superconducting metal, and is further preferably high resistance metal, and is further preferably the metal manginin which is vacuum epoxied into the toroidal input cavity of a "hybrid" configuration SQUID. Other suitable metals are beryllium-copper or copper-nickel and the other bronzes. In other configuration SQUIDs, such as SQUIDs entirely implemented in thin film technology by depositions upon a substrate, the modulation coil will similarly still be constructed of non-superconducting material. A preferred material is palladium or any platinum family metal which is routinely used for resistances in thin film junction technology, but other noble metals, and refractory materials particularly tungsten and mollybedenum are suitable. A SQUID so modified in construction will continue to function in sensors like as to the unmodified SQUIDs. This SQUID apparatus modification alone, without more, will accord that the long-term, or so-called d.c., thermal response of the SQUID sensor will be much reduced. Although this effect alone is very useful, the short-term, or so-called a.c., thermal response of the SQUID is not significantly diminished merely by that first aspect of the present invention which is solely a modification and improvement to the apparatus of the SQUID.

As a second aspect of the present invention, a method of de-sensitizing the improved modified SQUID apparatus in order that such de-sensitized apparatus should exhibit reduced total thermal response, including in the short-term, or a.c., component of such thermal response, is employed. The method employed is in the nature of an initialization, or re-initialization, of a SQUID sensor not elsewise in use and consists of temporarily applying an alternating current waveform for a short period of time to a non-superconducting element proximate to and in thermal communication with the SQUID sensor while the non-superconducting element and SQUID sensor are at cryogenic temperatures sufficient to induce superconductivity. The preferred non-superconducting element is the non-superconducting modulation coil of the improved modified SQUID. Alternatively, the non-superconducting element can be an input coil made of non-superconducting material if, in operational usage, the SQUID sensor is desired to be used only at very high frequencies. Also alternatively, the non-superconducting element can be an element elsewise independent of the SQUID sensor and unused during operational utilization of the SQUID sensor. Like as the materials choices for the non-superconducting modulation coil, the non-superconducting element (which is preferably the selfsame modulation coil) is preferably constructed of metal, and preferably of manganin or berryllium-copper or copper-nickel or any bronze for "hybrid" SQUIDs; and preferably of noble metal particularly palladium or any platinum family metal, or of refractory metal particularly tungsten and mollybedenum, for thin film SQUIDs. This temporarily applied alternating current waveform, acting upon the non-superconducting element, heats the SQUID and the associated circuit wiring, including the non-superconducting element itself. It is believed that the thermal response of SQUID sensors, and especially the short-term, or a.c., thermal response is associated with the motion of fluxoids, or changes in the magnetic field distribution of fluxoids trapped in the superconducting material of the SQUID. It is also believed that the application of the alternating current waveform to the non-superconducting element proximate to the SQUID and its associated circuitry produces heat which either annihilates the fluxon, or drives such fluxons to stable positions in which they do not readily couple flux into the SQUID.

The alternating current waveform applied to the non-superconducting element, preferably to the normal metal modulation coil of the modified SQUID, in the method of the invention is preferably controlled in characteristics, particularly in the parameters of amplitude and fall time although the parameters of duration, frequency, and rise time are also established within certain nominal limits.

The preferred amplitude is dependent upon the type of SQUID (e.g., hybrid or all thin film) and the individual SQUID under test. Nominally, such amplitude is in the range of 130 milliamperes root mean square (r.m.s.) for SQUIDs of the "hybrid type" of normal dimensions. The correct amplitude, exact to the limits by which the effects of such amplitude in diminishing the thermal response of the SQUID may be observed by test equipment, is establishable by an enhancement to the second aspect method of the present invention. This enhancement is to perform normal connection/reconnection of the SQUID sensor and measure the thermal of the SQUID after each of successive applications of the alternating current waveform. Proceeding from the initial nominal value, an amplitude can be determined for the alternating current waveform which will essentially reduce the total thermal response in the SQUID being de-sensitized to 0 within the limits of available measurement capability.

The fall time of the de-sensitizing alternating current waveform is preferably less than one-tenth of a second, and is further preferably as fast as possible. The preferred duration of the applied alternating current waveform is from 100 milliseconds to 20 seconds, but longer durations are not adverse. The preferred waveform frequency is from 30 hertz to 6 kiloHertz, within which range the obtained results in desensitizing the SQUID of thermal response are indistinguishably different. Finally, the rise time of the applied alternating current waveform is not of great significance, but is nominally maintained at less than one-half second.

The entire operation of temporarily applying an alternating current waveform to the non-superconducting modulation coil of a SQUID in order to de-sensitize such SQUID from exhibiting a thermal response is referred to as "defluxing" the SQUID. Once defluxed, a SQUID will maintain its reduced thermal response so long as such SQUID is maintained at superconducting cryogenic temperatures. It does not injure a SQUID to be defluxed, and the same SQUID may be defluxed upon each of repetitive reinsertions into the superconducting cryogenic environment. The entire defluxing operation may be accomplishable by relatively unsophisticated means, including by a manually operated variac impressing an appropriately current limited pulse of 60 hertz standard building power to the non-superconducting modulation coil of the SQUID for such a crudely determined period of time as is established by a manual, hand-twisting, actuation of the variac control. Alternatively, a control circuit is described within the present specification which allows the uniform generation of an alternating current deflux waveform of regular and nominal characteristics. The thermal response of multitudinous SQUIDs of diverse types is uniformly reducible to 0 (within test equipment measurable levels) by the application of the defluxing method of the present invention.

BRIEF DESCRIPTION OF THE DRAWINGS

FIG. 5, consisting of FIG. 5a through FIG. 5c, respectively show the temperature change within the dewar, the pressure error signal within the dewar, and the thermal response of a particular "hybrid" SQUID responsively to such changes.

FIG. 9, consisting of FIG. 9a and FIG. 9b, respectively show the fluxoid orientations which couple more, and which couple less, flux to the toroidal cavities of the SQUID canister and to the input or modulation coils therein such toroidal cavities.

FIG. 10, consisting of FIG. 10a and FIG. 10b, respectively show the pressure error signal and the SQUID output signal of an actual "hybrid" SQUID which is possessed of a non-superconducting modulation coil, being a first aspect of the present invention.

FIG. 11 shows a preferred embodiment circuit for obtaining an alternating current defluxing waveform, the application of which a.c. waveform to the modified SQUID is a second aspect of the present invention.

FIG. 12 shows the generic form of the alternating current deflux waveform which, in accordance with the second aspect of the present invention, is applied to the non-superconducting modulation coil of a SQUID in order to reduce the thermal response of such SQUID.

FIG. 13a, consisting of FIG. 13a-1 through FIG. 13a-3, respectively show the temperature within the dewar, the pressure error signal within the dewar, and the output response of a particular SQUID which SQUID is not yet subjected to the defluxing method of the present invention.

FIG. 13b, consisting of FIG. 13b-1 through FIG. 13b-3, respectively show the temperature within the dewar, the pressure error signal within the dewar, and the output signal of a SQUID as such SQUID is, as time proceeds from left to right in FIG. 13b-1, (1) placed in the vapor above the liquid helium within the dewar, (2) subjected to temperature and pressure variations showing that the SQUID output is still responsive thereto, (3) subjected to the defluxing waveform, and (4) reimmersed in the liquid helium within the dewar.

FIG. 13c, consisting of FIG. 13c-1 through FIG. 13c-3, shows the temperature change within the dewar, the pressure error signal within the dewar, and the output of that now defluxed SQUID which was the same SQUID which was seen before defluxing in FIG. 13a and during defluxing in FIG. 13b.

DESCRIPTION OF THE PREFERRED EMBODIMENT

1. Introduction to the Thermal Response Problem in SQUIDs Dealt with by the Present Invention Superconducting Quantum Interference Devices (SQUIDs) and their associated interface circuitry have been found to exhibit a thermal dependency. This dependency shows itself as a change in SQUID output, either voltage or current output, with a corresponding change in the temperature of the SQUID. In actual investigation temperature coefficients as low as a few milli $\Phi_o/°K.$ to as high as 300 $\Phi_o/°K.$ (the latter was purposely induced) have been found.

A variety of mechanisms are proposed to explain this thermal response in superconducting SQUID based sensors. These include thermal expansion, thermoelectric effects, thermal dependence of the susceptibility of magnetic impurities, temperature dependence of junction critical current, thermally induced changes in r.f. pick-up, the presence of materials with superconducting transitions near the operating temperature, temperature dependence of the penetration depth of superconducting materials, and temperature depencence of the superconducting coherence length.

The thermal response of SQUIDs is not desirable in the use of SQUIDs as sensors, typically in such applications as superconducting gradiometer, magnetometer, and magnetoencephalographic systems. Due to the thermal response, the SQUID output exhibits both drift and noise due to unavoidable variations in pressure and temperature within the cryogenic environment of the SQUID. The present invention is resultant from theoretically analyzing, experimentally isolating and investigating, and then substantially abating by an improved SQUID apparatus and new operational method, the thermal response in direct current (d.c.) SQUIDs and associated flux coupling circuitry.

Figure 1:
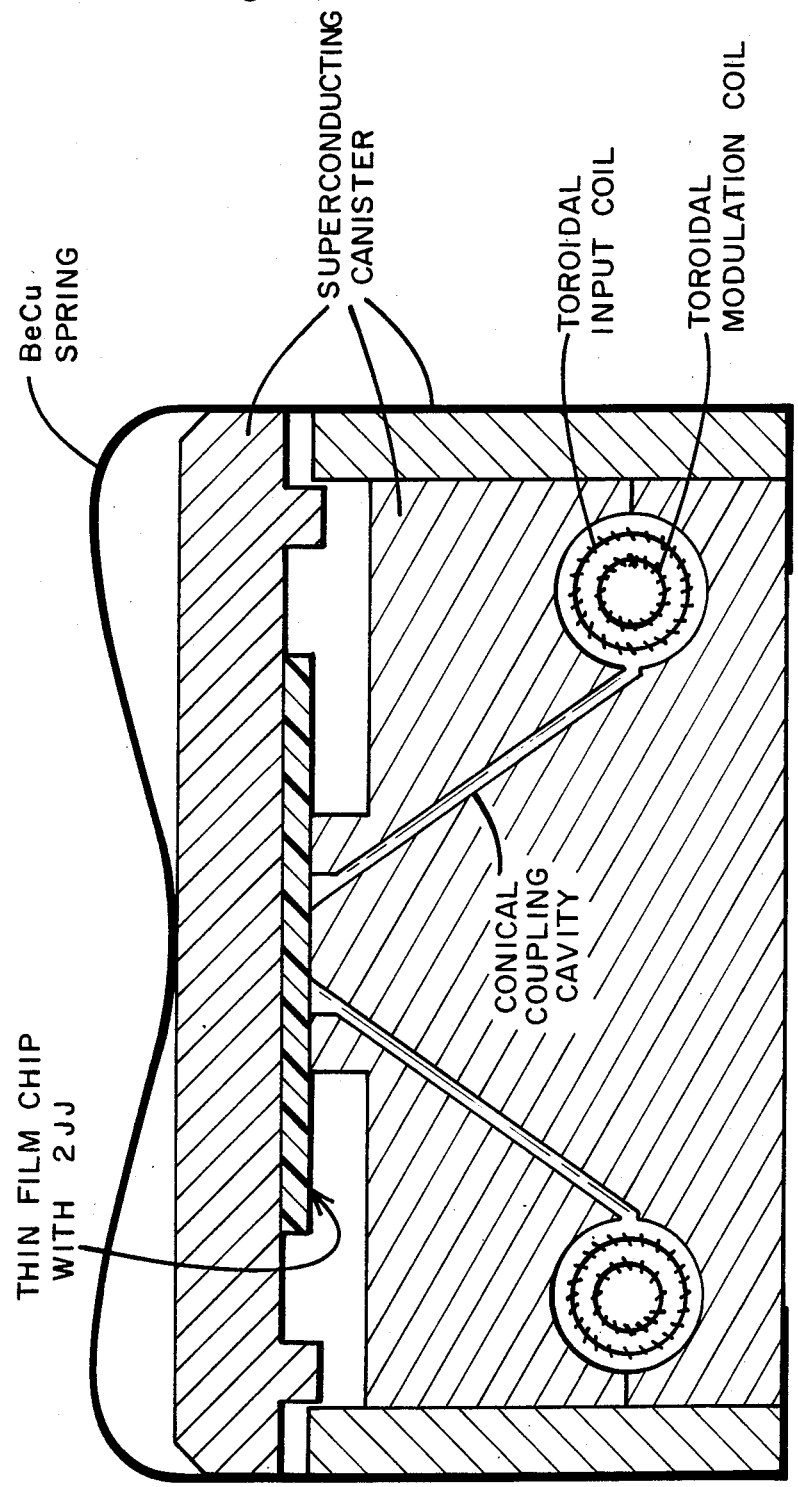
FIG. 1 shows a cross-sectional view of a prior art (commonly called) "hybrid" direct current SQUIO with all refractory thin film Josephson Junctions.

2. Experimental Investigation of the Thermal Response Problem in SQUIDs Dealt with by the Present Invention Thermal response effects have been measured in a variety of SQUID types: commercial radio frequency (rf) point contact, rf with thin film tunnel junctions and direct current (d.c.) with thin film junctions. For illustration of the thermal response the present discussion will center on a (commonly called) "hybrid" direct current SQUID with all refractory thin film Josephson Jucntions such as is taught in U.S. Pat. No. 4,403,189 for SUPERCONDUCTING QUANTUM INTERFERENCE DEVICE HAVING THIN FILM JOSEPHSON JUNCTIONS to Simmonds and in U.S. Pat. No. 4,482,093 for LOW STRAY INDUCTANCE SQUID CANISTER to Gershenson, et al. The cross section of such a prior art hybrid SQUID is shown in FIG. 1. See also the reference papers by D. L. Fleming, M. Gershenson. R. J. Schneider and M. F. Sweeny, "Hybrid DC SQUID Fabrication and Characterization", IEEE Trans. Mag., 19, p. 2056 (1983) and by D. L. Fleming, M. Gershenson, R. Hastings, G. F. Sauter, and M. F. Sweeney, "Hybrid DC SQUIDs Containing All Refractory Thin Film Josephson Junctions", Applied Superconductivity Conference, San Diego (1984).

Figure 2:
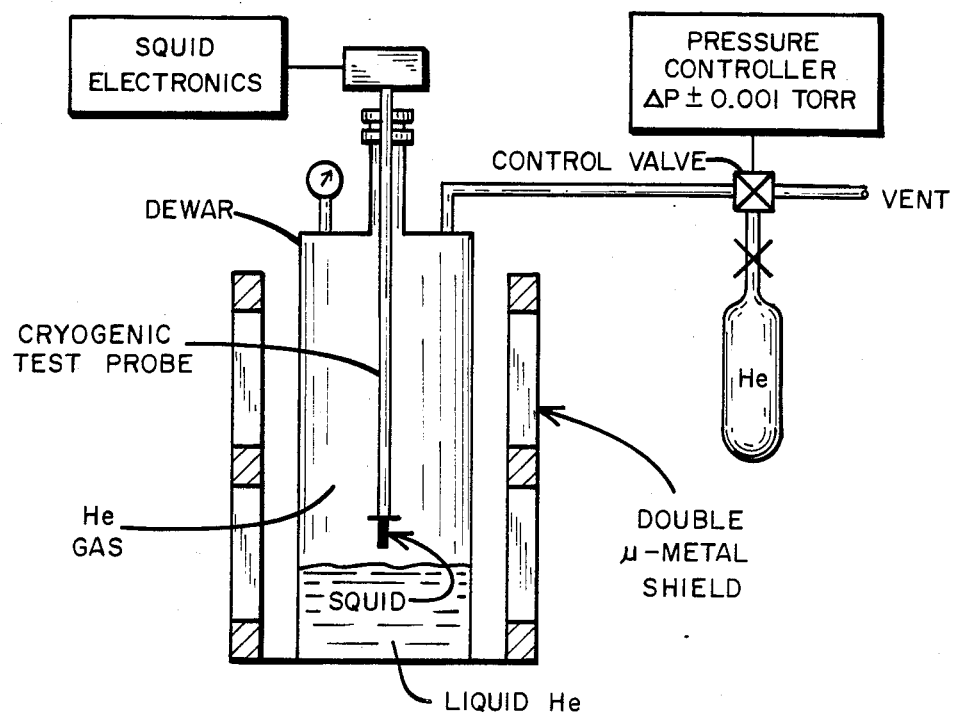
FIG. 2 shows a diagrammatic representation of the experimental apparatus by which the thermal response of a SQUID, which thermal response of a SQUID is dealt with by the apparatus improvement and method of the present invention, may be measured.
Figure 3:
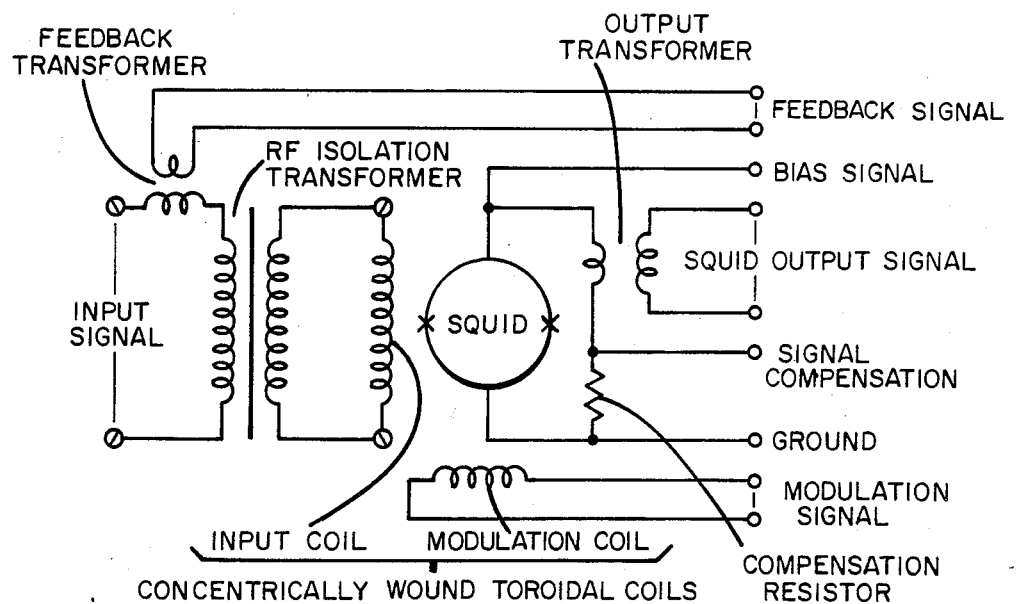
FIG. 3 shows a schematic representation of a SQUID and the associated interface circuitry thereto such SQUID, particularly of the interface circuitry to a "hybrid" SQUID although the principles are like as support of the interface to all SQUIDs.
Figure 4A:
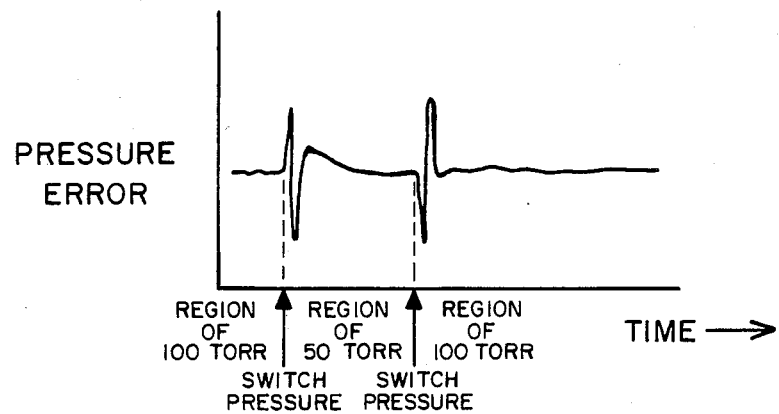
FIG. 4, consisting of FIG. 4a through FIG. 4c, respectively show a pressure error signal resultant from a pressure change in the dewar, the temperature change resultant to such pressure change, and the shift in the SQUID output signal responsive to such pressure and temperature change.
Figure 4B:
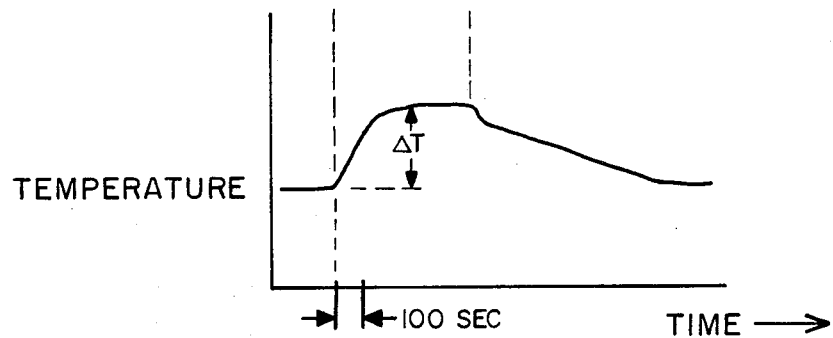
Figure 4C:
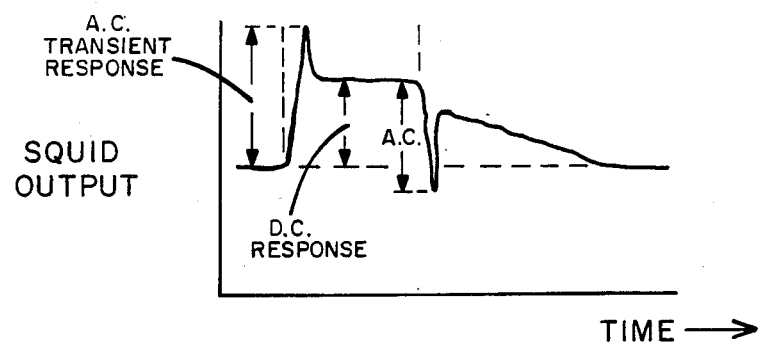

The experimental apparatus by which the thermal response of a SQUID may be observed is shown in FIG. 2. The package labled SQUID contains the SQUID sensor and interface circuitry like as to that part of the interface circuitry taught to be within the cryogenic environment in U.S. Pat. No. 4,389,612 for APPARATUS FOR REDUCING LOW FREQUENCY IN DC BIASED SQUIDs to Simmonds, et al. Such prior art interface circuitry within the cryogenic environment is further shown in FIG. 3. The DEWAR shown in FIG. 2 is pressurized with liquid helium gas (LHe) via a PRESSURE CONTROLLER that has +1 millitorr stability. Any pressure change causes a temperature change which in turn causes a shift in the SQUID output signal. This is illustrated in the sequence of FIG. 4a through FIG. 4c. The thermal coefficient is determined by dividing the SQUID output change by the corresponding temperature excursion. A silicon diode, Lake Shore Cryotronics, Inc. model DT-500 FP, was used as the temperature sensor and was attached to the lead (Pb) base of the SQUID package.

The SQUID output generally exhibited two distinct signal features. A transient signal (AC coefficient) will occur when the pressure was changed and a steady signal difference (DC coefficient) will persist for as long as the temperature is held constant. The time it took for these SQUID output changes to occur was generally minutes from the onset of the pressure change, whereas the pressure came to its new value in a matter of only seconds. In most of the present study the pressure was cycled from 100 Torr to 50 Torr (above atmosphere). This caused a 65 m°K. temperature change at the SQUID when immersed in the liquid. When the SQUID was in the vapors above the liquid a somewhat greater temperature excursion was measured.

Throughout an experimental investigation of SQUID thermal response utilizing the experimental apparatus of FIG. 2 one result was very consistant; namely that the thermal coefficients were not consistant from one run to another. Orders of magnitude changes in the thermal coefficients were observed as the SQUID was temperature cycled from room temperature. Once the SQUID had reached liquid Helium (LHe) temperature the coefficients remained fairly constant as the pressure was repeatably cycled from 100 to 50 Torr. Another consistant observation was that cooling in a low ambient magnetic field (inside a $\mu$-metal shield) produced lower thermal coefficients. This suggests a trapped flux mechanism may be responsible for the thermal sensitivity.

Many experiments were performed to identify the sources of the thermal sensitivity. FIG. 5a through FIG. 5c respectively show the temperature variation, the pressure error signal, and the output of a typical SQUIO sensor as the pressure was changed from 100 to 50 Torr and back to 100 Torr. The thermal coefficients in this particular experiment are derivable from the data shown in FIG. 5 for both the peak, short term, response of the SQUID—called the AC component of thermal response—and the long term response of the SQUID—called the DC component of thermal response. In the particular experiment shown in FIG. 5 the short term change in SQUID output divided by the short term change in temperature approximately equals seven hundred and fifty one-thousandths of one flux quantum $\Phi_o$ per each degree Kelvin change in temperature, i.e. $\Delta S/\Delta T$ (AC)$\simeq$750 m$\Phi_o$/°K. Likewise the lonq term thermal response $\Delta S/\Delta T$ (DC)$\simeq$175 m$\Phi_o$/°K.

In other experiments with the same SQUID the transients occurred at both edges of the temperature pulse and often they would be different polarity. In one series of experiments the entire SQUID (shown in FIG. 1) and interface circuit (shown in FIG. 3) was built up one component at a time in order to see when the greatest change would occur. This again produced inconsistent results. At first the coefficients were consistantly low until an indium-silver (In to Ag) soldering step was made. This caused an abrupt increase in the value of the coefficients. It appeared that InAg soldering might be suspect, however, when the circuit was disassembled a coefficient reduction was not noted and when the experiment was repeated no extraordinary changes were measured.

These somewhat inconsistent results in determining the thermal response of a d.c. SQUID can be qualitatively explained by flux trapped in (1) the wires of the input coil, (2) the wires of the modulation coil, (3) the SQUID, (4) the superconducting portions of the interface circuitry and/or (5) the lead (Pb) canister. A temperature change would then (1) change the position or orientation of the trapped flux, (2) change the penetration depth and therefore the coupled flux to the SQUID cavity or (3) expel the flux altogether. Prior art references dealing with trapped flux are the papers by J. H. Claassen, S. A. Wolf, and D. U. Gubser, "Thermal Sensitivity of an RF SQUID", Applied Superconductivity Conference, San Diego (1984) and also by T. R. Clem, "Superconducting Magnetic Shielding for SQUID-based Systems Operating in Low Fields", Applied Superconductivity Conference, San Diego (1984). A more extensive theory of the thermal response of a d.c. SQUID is given in section 3 following.

3. Theory and Analysis of the Thermal Response in SQUIDs 3.1. Construction and Schematic Model of the DC SQUID A schematic of the d.c. SQUID and associated input circuitry, further discussed in the aforementioned papers by D. L. Fleming, M. Gershenson, and R. J. Schneider, IEEE Trans. Mag. 19, p. 2056 (1983) and by D. L. Fleming, M. Gershenson, R. Hastings, G. F. Sauter, and M. F. Sweeny, Applied Superconductivity Conference, San Diego (Sept. 1984), is shown in FIG. 3.

The associated input circuitry is mounted on a printed circuit (pc) board, and is housed, along with the SQUID, within a 0.46 inch inside diameter (i.d.) lead shield can. The radio frequency (r.f.) isolation transformer is wound as a solenoid (146 mil i.d.) using niobium titanium (NbTi) wire for both primary and secondary. The superconducting input and modulation coils also of NbTi are wound concentrically and housed within the toroidal cavity of the superconducting SQUID canister nominally machined of lead although niobium is also used. Extensive thermal response experiments have been performed on this system with an open input as shown in FIG. 3. (The thermal response is comparable in the open and shorted input configurations.) With open input, the important components are the secondary of the r.f. isolation transformer (3.5μ Henry) and the SQUID input coil (2μ Henry), which form a closed superconducting loop. Given the mutual inductance coupling the input coil to the SQUID of 23 nHenry, a simple calculation shows that one part in 240 of the flux linking the r.f. secondary/input coil loop is coupled to the SQUID. With these details in mind, contributions from some of the sources of thermal response may be estimated.

3.1. Thermal Expansion

Expansion coefficients at 4.2°K. are on the order of one part in $10^8$ per degree Kelvin (°K.) for refractory metals, and about two orders of magnitude larger for lead and epoxy materials. Consider then the lead shield canister of the SQUID. The system is typically cooled in magnetic fields on the order of 0.005 Gauss. Suppose then that this field is trapped within the lead canister; then the flux linking the r.f. transformer secondary will be on the order of 75,000 $\Phi_o$, and 1/240 of this, or about 300 $\Phi_o$ will be coupled to the SQUID. When the lead canister expands due to thermal variations then the flux trapped within it remains constant, causing the field intensity within the canister to decrease. The flux coupled to the r.f. transformer decreases by a few parts in a million per degree Kelvin, and so the SQUID temperature coefficient caused by thermal expansion of the lead canister is on the order of 0.6 m$\Phi_o$ per °K. This is two to three orders of magnitude less than the observed thermal response. In general we conclude that thermal expansion coefficients are too small at 4.2°K. to cause the observed thermal response.

3.3. Thermoelectric Effects

Thermoelectric currents will flow in normal metals which are subjected to a temperature gradient. The fields caused by these currents can be picked up at the superconducting input loop and coupled to the SQUID. It should be noted that this mechanism could be used to explain the transient part of the observed thermal sensitivity, but not the reversible d.c. portion of the thermal response. As will be noted in the next section 4, the transient portion of the response will remain about the same magnitude when the SQUID modulation coil is changed from a superconductor to a normal metal, and this would indicate that thermoelectrics within the modulation coil are not a prime contributor. It is worth noting however that thermoelectrics which occur during cool down of the sensor may provide the limiting cool-down magnetic field. Thus it is observed that while thermal response of the system generally decreases with decreasing external cool-down magnetic field, no further decrease is observed for cool-down magnetic fields below about a milli-Gauss. The heating-/defluxing method of the present invention which will ultimately be discussed in section 5 would not seem to mitigate thermoelectric effects.

3.4. Magnetic Impurities

Care is taken in construction of SQUID componets to minimize impurities. Simple calculations indicate that large quantities of impurities are required to produce the observed thermal response via coupling to the SQUID input circuitry. In fact, this has been tested and proven experimentally by inserting magnetic materials into the lead canister in an investigation undertaken by D. Overway and R. Biggers, Naval Coastal Systems Center, Panama City, Florida, (unpublished private communication of experimental data (1984)).

3.5. Temperature Dependence of Junction Critical Current

This dependence is widely accepted in the prior art as an adequate explanation of the measured intrinsic SQUID temperature coefficient. However, when the input circuitry is connected to the SQUID, the system temperature coefficient generally increases by one to two orders of magnitude; thereby belying that temperature dependence of junction critical current should be the sole mechanism of thermal response in SQUIDs.

3.6. R.F. Pick-up

Radio Frequency (r.f.) signals are carried into the lead canister for modulation and biasing, and radiation from these lines can be picked up and possibly converted into a d.c. signal at the output of the SQUID electronics. Changes in the antenna pattern with temperature can be induced by thermal expansion and changes in the penetration depth of superconductors. If care is taken to minimize or cancel the pick-up, it will not make a major contribution to system thermal drift.

3.7. Materials with Transitions near 4.2° K.

Lead alloy solders are particularly offensive in SQUIDs since they exhibit a continuous transition to the superconducting state in the neighborhood of 4.2° K. (operating temperature). This is reported by D. Gubser and J. Claassen, Naval Research Laboratories, Washington D.C., (unpublished private communication of experimental data (1984)). As a solder blob goes superconducting it becomes a magnetic dipole with its moment anti-parallel to the ambient field. Such a blob in the neighborhood of the r.f. transformer would provide a large thermal coefficient. These materials are normally avoided in the construction of SQUID systems, and are recommended to be avoided.

3.8. Penetration Depth Temperature Dependence

Figure 6:
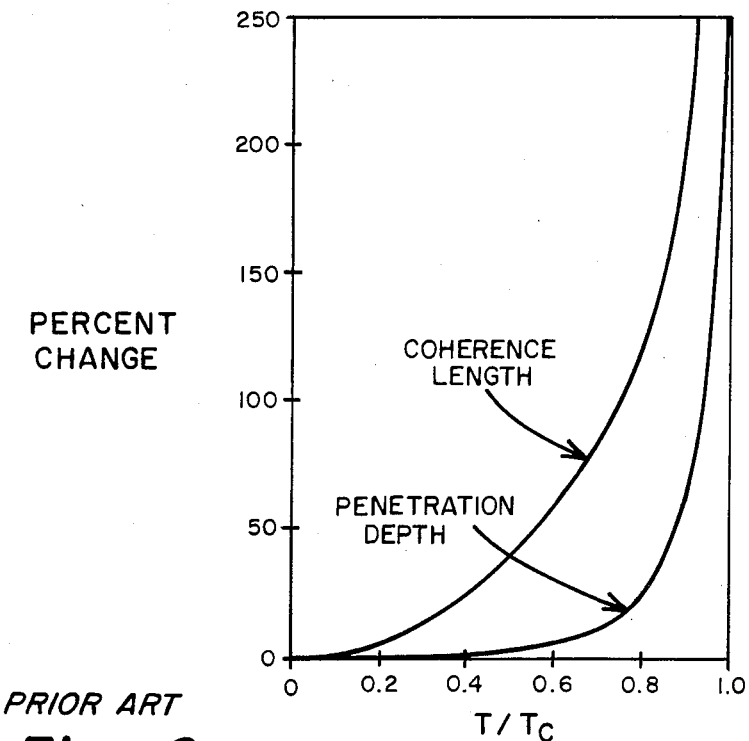
FIG. 6 shows the percentage change in penetration depth and in coherence length as a function of reduced temperature in, and for, SQUID-based systems operating in low magnetic fields.

The percentage change in penetration depth as a function of reduced temperature is shown in FIG. 6. It has been shown experimentally by T. R. Clem, reported in "Superconducting Magnetic Shielding for SQUID-based Systems Operating in Low Fields", Applied Superconductivity Conference, San Diego (Sept. 1984), that this theoretical temperture dependence is obeyed by the lead canisters used in the d.c. SQUID for which experimental results were discussed in section 2. It was also found that the magnitude of the measured temperature coefficient determined a zero temperature penetration depth of 6,900 Å, some 20 times the published value for pure films, and this was attributed to surface roughness. Following a treatment similar to that used in the thermal expansion computation above, it is found that changes in penetration depth of the lead canister cooled in a field of 0.005 Gauss yield a SQUID temperature coefficient of 5 m$\Phi_o$ per °K., which is one to two orders of magnitude smaller than the observed thermal response. (The observed large zero temperature penetration depth is used in this calculation.) Experimentally it was determined that neither shielding of the r.f. transformer nor winding it in a toroidal configuration (to eliminate pick-up of the magnetic field within the lead canister) significantly changed the thermal response. It should be noted that thermal responses which are measured after cool-down in fields on the order of 0.5 Gauss can be explained by the penetration depth model. This result was predicted in the paper "Thermal Sensitivity of an RF SQUID" by J. H. Claassen, S. A. Wolf, and D. U. Gubser, Applied Superconductivity conference, San Diego (Sept. 1984). In fact, it has been observed by R. Biggers, Naval Coastal Systems Center, Panama City, Florida (unpublished private communication of experimental data, scheduled for publication at Applied Superconductivity Conference, Coolfont (Nov. 1984)), that a magnetic field applied within the shield canister during cooldown can be used to cancel the thermal response to first order.

The change in inductance of the superconducting coils with temperature provides another mechanism for thermal response. A careful calculation of the dependence of the inductance of a superconducting coil upon penetration depth, carried out to first order in the ratio of penetration depth to wire radius, indicates that for the NbTi wire this effect yields a thermal response several orders of magnitude below the measured value.

3.9. Coherence Length Temperature Dependence

Figure 7A:
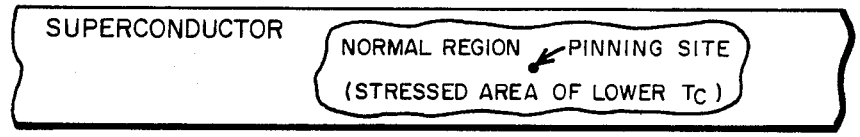
FIG. 7, consisting of FIG. 7a through FIG. 7c, diagrammatically illustrates the sequence and mechanism for the formation and trapping of fluxoids during cooldown of a superconducting material.
Figure 7B:
Figure 7C:
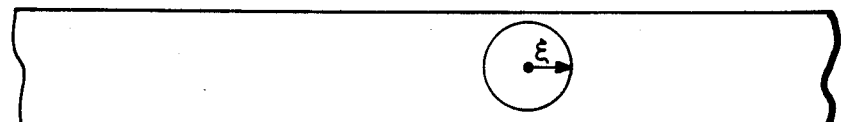

The percentage change in coherence length is also plotted in FIG. 6 as a function of reduced temperature. This length defines the radius of a fluxoid which is trapped in a superconductor during cool-down. The mechanism for formation and trapping of fluxoids during cool-down of a superconductor is diagrammatically, and qualitatively, illustrated in the sequence of FIG. 7a through FIG. 7c. In FIG. 7a a region of material still normal and not yet superconducting exits around a pinning site, being a stressed area of lower critical temperture $T_C$ than those surrounding portions of material which have already turned superconducting. In FIG. 7b the normal, non-superconducting, region continues to shrink as the temperature is reduced: the total flux within this region remaining, however, constant. Finally at lowest temperatures in FIG. 7c a critical field is reached in the normal region, a trapped fluxoid thereafter remaining stable with a domain radius equal to the coherence length. Clearly the fluxoids will most easily penetrate materials of small dimensions.

Figure 8A:
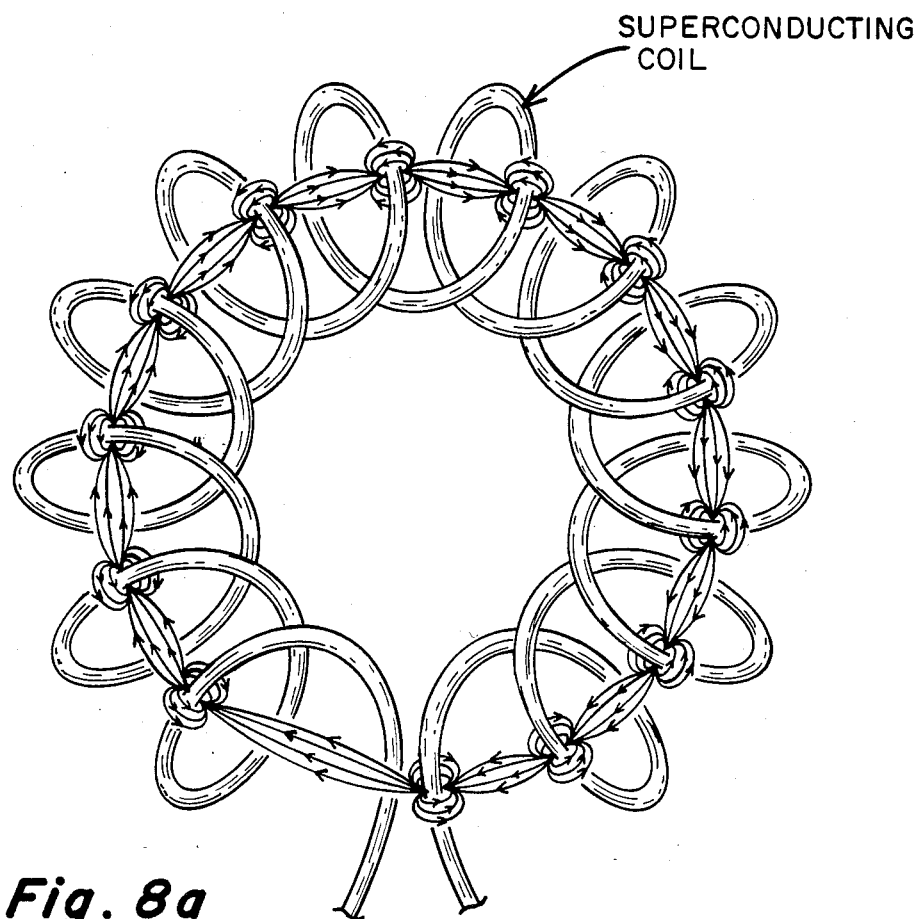
FIGS. 8a and 8b show a diagrammatic conception of how field lines from trapped fluxoids within a superconductor may contribute to the overall field pattern within a SQUID body, and particularly to the superconducting coils of the associated circuitry thereto such SQUID.
Figure 8B:
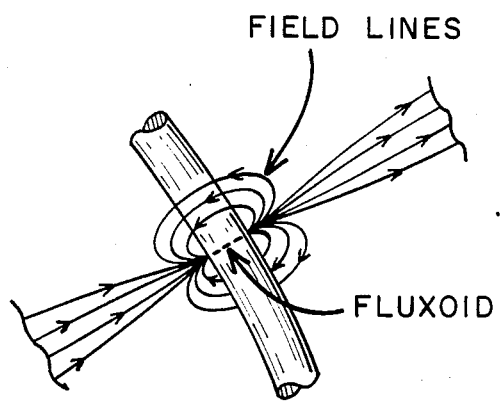

Continuing this hypothesis of fluxon capture, especially in superconducting materials of small dimension, consider the superconducting NbTi wire of the SQUID input coil. The field lines emanating from the fluxoid will contribute to the overall field pattern within the SQUID body, and some of this field will couple flux to the SQUID cavity. FIG. 8 shows a diagrammatic conception of this phenomenon. The amount of flux coupled to the SQUID will depend critically upon the orientation of the fluxoid relative to the toroidal cavity in the SQUID canister as is diagrammatically illustrated in FIG. 9a and FIG. 9b. FIG. 9a shows the fluxoid orientation which couples more flux from the fluxoid to the toroidal cavity of the SQUID canister (and to any input or modulation coil therein). FIG. 9b shows the fluxoid orientation which couples less flux to the toroidal cavity of the SQUID canister (and to any input or modulation coil therein). Note also in FIGS. 9a and 9b that the field lines are deflected by all superconducting surfaces. As the temperature changes, the radius of the fluxoids changes, and the overall field pattern will change.

With cool-down in a 0.005 Gauss field, about 1,000 single flux quantum fluxoids could be trapped in the wire of the superconducting input coil. If one percent of their flux couples to the SQUID, and this changes by five percent per degree with temperature, a significant thermal drift is produced. When the SQUID is disconnected from the input circuitry and cooled in a uniform field, the fluxoids which are trapped in the toroidal coil will be oriented along the cool-down field, and contributions to the SQUID flux from opposite sides of the toroid will cancel. Thus the SQUID intrinsic thermal drift is not significantly affected by the fluxoids trapped in the input coil. When the input r.f. transformer is connected and exposed to a cool-down field, a net applied flux will be transduced to the input coil, and the input coil fluxoids will be frozen into an orientation that couples flux to the SQUID as shown in FIG. 8.

4. An Improved SQUID Apparatus Using a Non-Superconducting Modulation Coil to Reduce the DC Component of Thermal Response in SQUIDs, being a First Aspect of the Present Invention The prior art SQUIO and associated electronics upon which all experimentation reported in previous section 2 was performed, and to which the theory and analysis presented in previous section 3 pertains, does exclusively in the prior art use coupling coils, most particularly both the input coil and the modulation coil, which are exclusively of superconducting material, nominally niobium-titanium (Nb-Ti) wire. The undesirable thermal response of SQUIDS reported in previous section 2, and the somewhat inconsistent results obtained in quantifying such thermal response (which results are particularly explained by trapped fluxoid theory explained in previous section 3), have led to a fundamental change in the SQUID and associated interface circuitry design.

This change in the SQUID and associated interface circuitry design, being a first aspect of the present invention, is this: make the modulation coil of non-superconducting material. The modulation coil is preferably changed to the material of non-superconducting metal from the prior art superconducting wire, nominally niobium-titanium (Nb-Ti). For "hybrid configuration SQUIDs the modulation coil is preferably changed to non-superconducting manganin wire, although beryllium-copper, or copper-nickel and other of the bronzes are also satisfactory. For SQUIDs implemented upon a substrate in thin film technology the non-superconducting metal palladium or others of the platinum family (such as are routinely used to make resistors in thin film technology) are preferred in implementation of the modulation coil, although others of the noble metals and the refractory metals particularly tungsten and mollybedenum may be used. The use of a modulation coil of non-superconducting material is pertinent to SQUIDs not only in the hybrid configuration as illustrated in FIG. 1, but also to SQUIDs in other configurations such as SQUIDs entirely implemented upon a substrate in thin-film technology (which planar SQUIDs are well known in the art; see, for example, DC SQUIDS 1980: THE STATE OF THE ART by M. B. Ketchen, IEEE Transactions on Magnetics, Vol. MAG-17, No 1, January 1981).

This simple change produces fairly dramatic results—but only on the long term, or so-called DC, component of thermal response. With a Manganin wire input coil the same hybrid SQUID for which thermal response was shown in FIGS. 5a–5c did, under like conditions with all interface circuitry attached and with a shorted sense loop, produce the output shown in FIG. 10b responsively to the like sequence of temperature and pressure variations (the pressure error signal only is shown in FIG. 10a for being easier to correlate with the induced changes in the SQUID output) to which the SQUID had previously been subjected. As is observable in FIG. 10a as compared with FIG. 5c, the long-term, DC, thermal response of the SQUID with a non-superconducting modulation coil was minimized, being for this particular SQUID less than 80 m$\Phi_o$/°K., relative to the DC thermal response of the identical SQUID with a superconducting modulation coil (which was 175 m$\Phi_o$/°K.). The DC component of the thermal response of this SQUID in repetitive experiments, of other hybrid SQUIDs repetitively exercised, and of other types of dc SQUIDs is consistently much lower if such SQUIDs are possessed of a non-superconducting, preferably Manganin wire (for hybrid configuration SQUIDs), as opposed to a superconducting, modulation coil. As may also be observed in FIG. 10b, the short term, or AC, component of SQUID thermal resonse was not substantially changed.

5. Method of Heating/Defluxing the Improved SQUID Apparatus to Reduce the Thermal Response in SQUIDs, Being a Second Aspect of the Present Invention The presence of normal, non-superconducting, metal within (or, in an alternative variant closely proximate to) the interface circuitry of a SQUID, meaning within the superconducting canister housing of a hybrid SQUID, presents of the interesting possibility of adding heat internally to the SQUID.

A method of exercising the improved SQUID apparatus—which apparatus incorporates normal and non-superconducting material within the SQUID cavity and proximate to the SQUID, nominally said non-superconducting material being the modulation coil of the associated circuitry to such SQUID—constitutes the second aspect of the present invention. Such method accords substantial elimination of both the short-term, AC, component of SQUID thermal response and also of the long-term, or DC, component of SQUID thermal response. Specifically, the method minimally consists of:

(1) establishing a non-superconducting (electrically conducting) element (nominally the existing modulation coil) in thermal communication with the SQUID and its associated circuitry (i.e., not shielded by a superconductor; being within the cavity of an encapuslated hybrid SQUID); then (2) after the SQUID, the associated circuitry of the SQUID, and the non-superconducting element has been cooled to superconducting temperatures (nominally in the 4.2 K. range of liquid helium) then connect the non-superconducting element (nominally the coil otherwise used for modulation) to an alternating current waveform generator, called a "de-flux" waveform generator; then (3) apply from the "de-flux" waveform generator an alternating current waveform to the non-superconducting element for a period of time; then (4) deenergize and/or disconnect the "de-flux" waveform generator, connect/re-connect if necessary all normal electronics interfacing to the SQUID and associated circuitry, and utilize the SQUID normally as a sensor system.

The minimalmethod so minimally performed will particularily diminish the short-term, AC, component of SQUID thermal response while having minimal, if any, deleterious effect on the long-term, or DC, component of SQUID thermal response—which DC component of SQUID thermal response is already substantially mitigated if the coil of non-superconducting material is, as is preferred, itself the modulation coil. If, in accordance with enhanced method as will shortly be explained the SQUID is detected after "de-fluxing" to still exhibit a long-term, or DC, component of thermal response than such long-term, DC, component is also further reducible to still more minimal levels by utilizing an alternatively larger alternating current "de-fluxing" waveform or by impressing direct current level of proper sign upon such alternating current "defluxing" waveform. As will be explained, the characteristics of the alternating current "de-fluxing" waveform including most particularly magnitude and fall time, and the magnitude and sign of any direct current component to be added to such alternating current "defluxing" waveform, are empirically determined in consideration of the observed thermal response of each individual SQUID, and SQUID type, and construction of SQUID sensor, which is undergoing "de-fluxing: Determination and adjustment of these "de-fluxing" waveform characteristics to a refinement which supports of essentially eradicating, meaning reducing to zero, the thermal response (in both a.c. and d.c. components) of a SQUID sensor to those limits to which such thermal response is experimentally measurable is not difficult or tedious, and may be readily accomplished proceeding from nominal "defluxing" waveform characteristics as hereinafter given.

The method of the present invention may be observed to be in the nature of an initialization; that is, something which is done to a SQUID sensor priorly to and preparatory to its functional useage. The method of the present invention can obviously be periodically repeated (the SQUID being off-line for sensing) while the SQUID remains in the cryogenic environment, and can be reperformed on a SQUID sensor whenever it is recooled to cryogenic temperatures. Experience has shown, however, that once a SQUID sensor is defluxed by the present method the of thermal response remains at a minimized level for longer than 24 hours and that, indeed, by the theory of that effect which the method of the present invention is hypothesized to produce (which theory is presented in section 6 following), the SQUID sensor may never need to be repetitively defluxed so long as it entirely remains at superconducting temperatures. SQUID sensor "flux-pops" (a phenomena detected during usage of SQUID sensors) and resets of the electronics interface to the SQUID do not affect the minimized thermal response achieved after application of the method of the present invention.

As a first enhancement to the method of the present invention the following steps may additionally be performed after the normal connection/re-connection of the SQUID sensor:

(5) Measure the SQUID sensor thermal response with the re-connected SQUID electronics, and then (6) Repeat steps (1) through (5), utilizing a larger amplitude defluxing alternating current waveform in step (3) upon each repetition, until the thermal response observable in step (5) has been minimized.

The straight forward concept presented by this enhancement procedure—that optimal defluxing can be achieved by the repetitive application of the deflux waveform at increasing amplitude coupled with repetitive observations of the minimization of thermal response thereby obtained—was invariably true for all SQUIDs tested. Sensors with superconducting components attached to the SQUID input can also be defluxed. Specifically, minimized thermal response has been obtained with the method of the present invention in sensors with superconducting flux transformers attached to the SQUID input in a variety of configurations. In all cases tested, a waveform amplitude could be found which minimized the thermal response.

In accordance with the enhanced procedure, for a given sensor cool-down the amplitude of the de-flux waveform should be varied until the thermal response is minimized. The sign of the response can be changed by the de-flux process, indicating that zero thermal response can be obtained. The drift is ordinarily reducible to levels below those which can be observed with the normal electronics circuitry interfacing to the SQUID.

As a further definition of step 3—the application of an alternating current waveform to "de-flux" a SQUID sensor—of the method of the present invention it should be recognized that the "de-flux" waveform may be controlled in any or all of the following parameters: waveform shape, waveform frequency, waveform rise time to 90%) amplitude, waveform duration at full (greater than 90% amplitude, waveform fall time, waveform amplitude, and the numbers of repetitions of the waveform. The preferred waveform shape is sinusoidal. The preferred waveform frequency is 30 Hz to 6 KHz, within which frequency range obtained results in reduction of thermal response, particularly for the "hybrid" SQUID type, seem to be indistinguishably different. The rise time is of only minor significance and is essentially arbitrary; however, in consideration of the next-specified duration and fall time, the rise time is nominally established at less than one-half ($\frac{1}{2}$) second. The preferred duration is from 100 msec to 20 seconds, but longer durations are not adverse. The fall time of the de-flux waveform appears, in accordance with the theory next presented in section 6, to be of some significance and is generally preferred to be less than one-tenth (0.1) seconds, is further preferred (as is obtainable by the waveform generating apparatus to be discussed) to be less than one hundredth (0.01) seconds, and it is not objectionable if the fall time is as fast as is electronically possible for that alternating current deflux waveform, and deflux waveform amplitude, which is in use. In accordance with this goal to truncate the applied deflux waveform with maximum rapidity, it is arguably suitable to actually stop the a.c. waveform at the point of a zero crossing, although the waveform generating apparatus to be herein described does not function with such sophistication. Finally, the preferred amplitude is determined for each SQUID sensor individually, but has been found to be generally in the range of 130 ma r.m.s. for SQUIDs of the "hybrid" type possessing characteristics (other than the non-superconducting modulation coil) and dimensions as detailed in section 3.1.

It should be recognized, the preferred characteristics of the deflux alternating current waveform duely considered, that the entire defluxing operation is generic, and obtainable by even the most unsophisticated means. Any box which puts out an alternating current waveform with variable frequency, rise time, fall time, duration, and amplitude will suffice. It is quite possible to do the de-fluxing manually using a variac: the initiation, amplitude, duration, and termination of a sinusoidal defluxing waveform is entirely determined by the human twisting of the variac output control to "on" and then back to "off". A preferred embodiment circuit for obtaining an a.c. deflux waveform is, however, shown in FIG. 11. The circuit provides the modulation envelope for a programmable SIGNAL GENERATOR such as Hewlett-Packard type 8116A into the amplitude modulation AM input of such SIGNAL GENERATOR. The circuit generates, upon activation of start switch S1, an a.c. pulse with rise time equaling fall time, with a fall time controllable by adjustment of variable resistor R1 to be between 1 microsecond and 0.5 seconds, and with a total pulse width controllable by adjustment at variable resistor R2 to be between 1 msec and 3.5 seconds. Other resistors are $\frac{1}{4}$ watt, 5% of values as indicated while diodes D1 and D2 are silicon IN3600 type. Active components are integrated circuit type 74LS555 and operational amplifier LM356. The selection of waveform type (e.g., sine, square, or triangle), the waveform frequency and the waveform amplitude are controlled by the SIGNAL GENERATOR, nominally Hewlett Packard type 8116A. The alternating current signal output of such SIGNAL GENERATOR, adjusted to be within the priorly described operational ranges for SQUIDs of "hybrid" type, is taken at the AC OUTPUT and transmitted TO (the) MODULATION COIL OF (the) SQUID which is undergoing defluxing.

The generic form of the alternating current deflux waveform applied to the non-superconducting element nominally a non-superconducting modulation coil, of a SQUID in order to reduce the AC component of thermal response of such SQUID is shown in FIG. 12. The consequential parameters of an actual a.c. deflux waveform applied to the "hybrid" SQUID (shown in FIG. 1) in one particular case are: frequency, 60 Hz; amplitude, 100 mA; rise time≃1 sec; duration 10–30 sec; fall time, as short as possible.

The actual results of the application of the a.c. defluxing waveform of FIG. 12 to a "hybrid" SQUID is shown as the before, during, and after sequence of FIGS. 13a, 13b, and 13c. It should be recalled that a circuit drawing of the SQUID and Feedback Transformer Assembly (FTA) is shown in FIG. 1. The modulation coil is concentric with the input coil in actual construction. The alternating current waveform applied to the modulation coil is coupled to input windings inductively, and if the input coil is driven normal, heat will also be conducted throughout the input circuit.

Within FIGS. 13a–13c, each of the top frames FIGS. 13a-1, 13b-1, and 13c-1 show applied changes in temperature which changes were realized by changing the dewar pressure shown in middle frames of FIGS. 13a-2, 13b-2, and 13c-2. The bottom frames of FIGS. 13a-3, 13b-3, and 13c-3 show the sensor output. The entire frames of FIG. 13a show the typical sensor thermal response when the sensor is cooled in a 2 mGAUSS field. Left to right of increasing time across the entire frames of FIG. 13b the SQUID probe has been (1) lifted out of the liquid helium bath into the helium vapors, (2) the a.c. defluxing waveform of FIG. 11b has been applied, and (3) the sensor re-inserted into the liquid. The trace FIG. 12b-3 shows the subsequent thermal response to this defluxing. The significance that the defluxing should have been done while the SQUID was above the LHe in the He vapors (the SQUID still being a superconducting temperature) is only that this represents an option which, for this particular SQUID, represents de-fluxing at the selfsame physical position, in the He vapors, wherein the SQUID will normally be used as a sensor.

Finally, in entire frames FIG. 13c the SQUID-containing probe is in vapors. In the frame of FIG. 13c-3 the thermal response has all but disappeared. Equivalent output response data for a SQUID alone (not connected to the FTA input) after the process has been applied would show phenomena equivalent to the frame of FIG. 13c-3: no thermal response would be observable. Essentially no thermal drift is measurable after optimal application of the method of the present invention. The results shown in FIG. 13c-3 do not represent optimal results, but can routinely be obtained for diverse SQUIDs. The amplitude and a short fall time of the defluxing alternating current waveform were the most critical parameters. In general different SQUIDs requried a somewhat different set of pulse parameters to minimize the thermal coefficients.

Other comments which may be made on the defluxing method of the present invention include that a SQUID which was constructed with very fine multifilimentary niobium wire imbedded in a copper matrix could not be defluxed. It is speculated that the flux is so tightly pinned in this wire matrix that it cannot be affected by the defluxing waveform: the coil cannot be heated by the alternating current waveform because the copper carries away the heat.

Another comment is that it has been observed that applying a d.c. current to the modulation coil for a brief period of time can alter the thermal response. The thermal drift is positive or negative depending upon the sign and magnitude of the d.c. current. It is suggested that adding a small d.c. level to the de-fluxing a.c. waveform will provide additional control of the de-fluxing process, via control of the d.c. level and sign. The d.c. level and sign should be set to an empiracally determined magnitude which just cancels the residual thermal response of all sources listed in section 3.1 through 3.8. This d.c. level is hypothesized to work by creating a small amount of trapped flux of opposite thermal response to existent trapped flux.

As still another comment, it is anticipated that the deflux method of the present invention could be automated by installing a heater and appropriate feedback control of the de-fluxing amplitude. In such a system, de-fluxing would proceed by initiating (pushing a button) a series de-flux/thermal response measurement cycles, which would successively and automatically minimize the thermal response of the SQUID undergoing defluxing.

As a final comment, there is considerable evidence that 1/f in d.c. SQUID devices is related to motion of trapped flux. It is conceivable that effective defluxing via the method of the present invention could reduce the 1/f noise. At the present time systematic studies to verify this hypothesis have not been made, and no claim is made as to the efficacy of the method of the present invention in reducing 1/f in SQUID sensors.

6. Theory of the Defluxing Method of the Present Invention

The simplistic statement of the current theory of the defluxing method of the present invention is this: fluxoids (being regions centered about impurities of higher than critical field within a superconductor, being wormholes in the critical field) are trapped in superconducting components of SQUID sensor systems in such a way that a net flux couples to the SQUID. Changes in temperature cause changes in the fluxoid field distribution, causing the SQUID sensor to exhibit an undesirable thermal response. When the alternating current de-flux waveform is applied, the superconducting components are heated. This makes the fluxoids mobile so that they can re-arrange. Because an alternating current is applied, the fluxoids tend to arrange in a configuration in which no net flux is coupled to the SQUID.

A more elaborate explanation of the theory is as follows. The application of an alternating current to a non-superconducting element, nominally the modulation coil, proximate to and in thermal communication with a SQUID and its associated circuitry SQUID evidently provides a treatment which can greatly reduce the SQUID sensor system thermal coefficient. The preferred on-superconducting modulation coil is concentric with and tightly coupled to the superconducting input coil, so that an alternating current of the same magnitude will flow in the input coil/r.f. transformer secondary loop. It is known that fluxoids in NbTi become mobile when a few hundred milli-amps are applied to the material; reference R. P. Heubener, *Magnetic Flux Structures in Superconductors*, p. 126 (Springer-Verlag, Berlin 1979). This current corresponds to the magnitude of alternating current required for the defluxing process. Once the fluxoids are mobilized, they will respond to the applied magnetic field of the coil, aligning preferentially along the field direction. It is observed that the alternating current defluxing current must be reduced to zero rapidly for the method of the present invention to be optionally effective. It is speculated that the alternating current must be zeroed before the fluxoids can be frozen into an orientation which represents a net flux coupling to the SQUID. Thus, when the method of the present invention is completed the fluxoids are aligned perpendicular to the coil axis (see FIG. 9b), and there is no net flux coupled to the SQUID. It is also conceivable tht the fluxoids could become randomly oriented (as in conventional degaussing) so that no net flux couples to the SQUID. Another suggestion is that the method of the present invention causes fluxoids of opposite polarity to combine and annihilate, reducing the field trapped in the system.

After the deflux method of the present invention is applied, the remaining thermal response may be of either sign, and occasionally it is reduced to below the system level and cannot be observed at all. In the latter case it is likely that a small net flux remains coupled to the SQUID with a temperature coefficient which just cancels (to first order) the remaining sources of thermal response. Further studies, both theoretical and experimental, are possible to further clarify the interesting mechanism for reducing thermal response of the present invention.

What is claimed is:

1. A Superconducting Quantum Interference Device (SQUID) sensor means comprising Josephson junction means, input means comprising an input transformer for supplying an input signal to said Josephson junction means, output means comprising an output transformer for obtaining an output signal from said Josephson junction means, a non-superconducting modulation coil means, waveform means for applying a waveform for a predetermined period of time to said modulation coil means so as to heat said modulation coil means prior to the utilization of said SQUID sensor means for sensing and while said SQUID sensor means is at a cryogenic temperature, first means for measuring the reduced thermal response exhibited by said SQUID after said waveform has been applied, and second means for adjusting said waveform as a function of said measurement, wherein said first and second means alternately measure and adjust until a desired thermal noise response is achieved.

2. A SQUID as claimed in claim 1 wherein said waveform means supplies an alternating current amplitude waveform of approximately 130 milliaperes r.m.s. to said modulation means.

3. A SQUID as claimed in claim 2 wherein said waveform is applied for a period of time in the range of 10 to 30 seconds.

4. A SQUID as claimed in claim 3 wherein said waveform has a frequency in the range of 30 Hertz to 6 kilo-Hertz.

5. A SQUID as claimed in claim 4 wherein a direct current bias signal is combined with said waveform.

6. A method of reducing the thermal response of a Superconducting Quantum Interference Device (SQUID) sensor means which comprises Josephson junction means, input means comprising an input transformer for supplying an input signal to said Josephson junction means, output means comprising an output transformer for obtaining an output signal from said Josephson junction means, and a non-superconducting modulation coil means, comprising the steps of bringing said SQUID to a cryogenic temperature range, applying a waveform for a predetermined period of time to said modulation coil means so as to heat said modulation coil means prior to the utilization of said SQUID sensor means for sensing and while said SQUID sensor means is in said cryogenic temperature range, measuring the reduced thermal response exhibited by said SQUID after said waveform has been applied, adjusting said waveform as a function of said measurement, and repeating said measuring and adjusting steps until a desired thermal noise response is achieved.

7. A method as claimed in claim 6 wherein said waveform supplies an alternating current amplitude of approximately 130 milliamperes r.m.s.

8. A method as claimed in claim 7 wherein said waveform is applied for a period of time in the range of 10 to 30 seconds.

9. A method as claimed in claim 8 wherein said waveform has a frequency in the range of 30 Hertz to 6 kilo-Hertz.

10. A method as claimed in claim 9 comprising the further step of applying a direct current bias signal to said SQUID along with said waveform.

* * * * *

UNITED STATES PATENT AND TRADEMARK OFFICE
CERTIFICATE OF CORRECTION

PATENT NO. : 4,689,559
DATED : August 25, 1987
INVENTOR(S) : Roger N. Hastings, Gerald F. Sauter, George F. Nelson It is certified that error appears in the above-identified patent and that said Letters Patent are hereby corrected as shown below:

In the title, delete "APPARATUS AND METHOD TO REDUCE THE THERMAL RESPONSE OF SQUID SENSORS" and substitute -- METHOD OF REDUCING THE THERMAL RESPONSE OF A SUPERCONDUCTING QUANTUM INTERFERENCE DEVICE -- .

Column 5, line 26, delete "SQUIO" and insert -- SQUID -- .

Column 8, line 17, delete "SQUIO" and insert -- SQUID -- .

Signed and Sealed this

Tenth Day of November, 1987

Attest:

DONALD J. QUIGG

Attesting Officer

Commissioner of Patents and Trademarks